United States Patent
Wang et al.

(10) Patent No.: US 6,284,556 B1
(45) Date of Patent: Sep. 4, 2001

(54) DIAMOND SURFACES

(75) Inventors: Wang Nang Wang, Lympley Stoke; Neil Anthony Fox, Cheltenham, both of (GB)

(73) Assignee: Smiths Group PLC, London (GB)

( * ) Notice: Subject to any disclaimer, the term of this patent is extended or adjusted under 35 U.S.C. 154(b) by 0 days.

(21) Appl. No.: 09/308,271

(22) PCT Filed: Dec. 12, 1997

(86) PCT No.: PCT/GB97/03445

§ 371 Date: Jul. 8, 1999

§ 102(e) Date: Jul. 8, 1999

(87) PCT Pub. No.: WO98/27568

PCT Pub. Date: Jun. 25, 1998

(30) Foreign Application Priority Data

Dec. 18, 1996 (GB) .................................................. 9626221

(51) Int. Cl.[7] .................................................. H01L 21/00
(52) U.S. Cl. ................................................ 438/20; 438/105
(58) Field of Search ........................... 438/20, 105, 317, 438/321; 257/77, 79, 82, 98, 13, 125, 137, 144, 163, 198

(56) References Cited

U.S. PATENT DOCUMENTS

| | | |
|---|---|---|
| 5,340,997 | 8/1994 | Kuo . |
| 5,345,141 | 9/1994 | Moyer et al. . |
| 5,504,385 * | 4/1996 | Jin et al. ............................. 313/310 |
| 5,709,577 * | 1/1998 | Jin et al. ............................. 445/24 |

FOREIGN PATENT DOCUMENTS

| | | |
|---|---|---|
| 0 493 804 | 7/1992 | (EP) . |
| 0 497 627 | 8/1992 | (EP) . |

* cited by examiner

Primary Examiner—Matthew Smith
Assistant Examiner—Calvin Lee
(74) Attorney, Agent, or Firm—Connolly Bove Lodge & Hutz, LLP

(57) ABSTRACT

A diamond grit surface is formed on a substrate (1) having a metal surface (2), such as nickel, by applying a paste (4) of low-grade diamond grit in a binder to the surface. After driving off the binder, the diamond coated surface is placed in a reactor chamber (10) having a microwave plasma reactor (11) and connected to a hydrogen gas pump (12). The substrate (1) is heated in the hydrogen atmosphere at a reduced pressure. The metal surface (2) acts as a catalyst in the presence of the hydrogen plasma to cause regrowth of the diamond (6), giving an improved size, shape and adhesion. The method may be used to make diamond surfaces in electron emitter devices, circuit boards or abrasive devices.

12 Claims, 2 Drawing Sheets

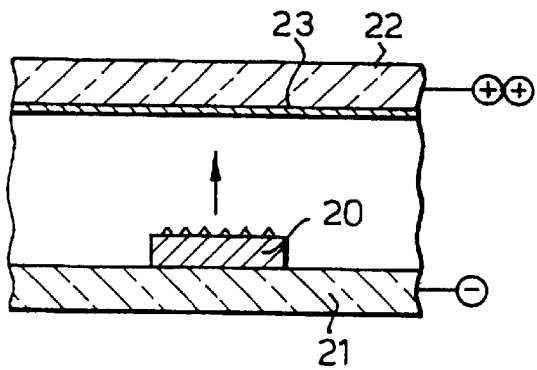
Fig.5.
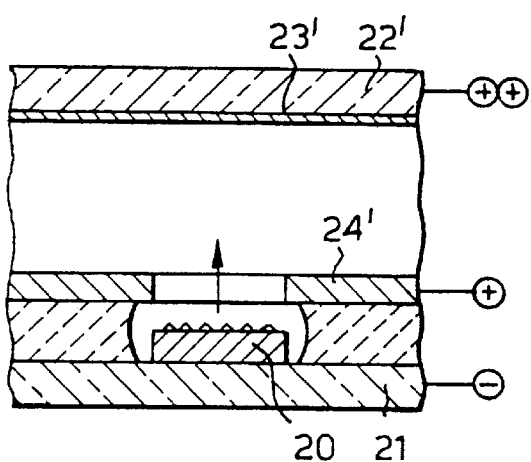
Fig.6.
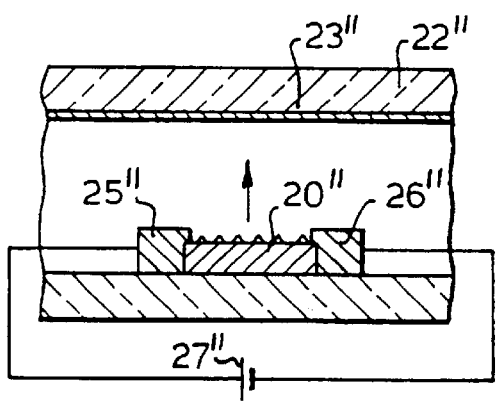
Fig.7.
Fig.8.
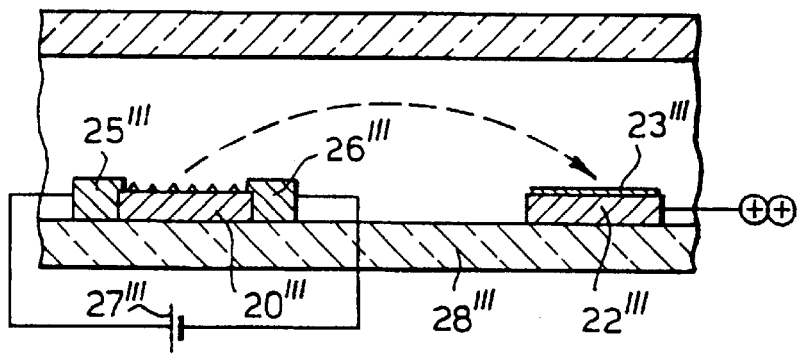

DIAMOND SURFACES

FIELD OF THE INVENTION

This invention relates to methods of forming diamond surfaces and to devices having diamond surfaces formed thereon.

BACKGROUND OF THE INVENTION

Diamond is a particularly useful material for forming electron emitters, because of its low work function and crystalline nature. Various methods have been proposed for forming diamond emitters. In the CVD (chemical vapor deposition) process, a gaseous carbon source at high temperature and pressure is used to deposit diamond onto a metal surface, such as of copper or nickel. It has also been proposed to use a solid carbon source at low pressure to deposit diamond onto a metal surface. A different technique is described in Journal Vacuum Science Technology, B 14(3), May/June 1996 pp 2060 to 2067. In this, a diamond grit is applied to a silicon substrate in a slurry or paste, and this is then heated in a reducing atmosphere to form electrical and mechanical contact between the diamond and silicon substrate. A layer of nickel may then be deposited on top of the diamond grit. EP-A-0718864 describes a field-emission device with diamond particles on a metal surface. Diamond is also extensively used in other applications, such as, as an abrasive.

It is an object of the present invention to provide an improved method of forming a diamond surface and a device having a diamond surface thereon.

According to one aspect of the present invention there is provided a method of forming a diamond surface comprising the steps of providing a metal surface, depositing a layer of diamond grit onto the surface and subjecting the surface and diamond grit to a gaseous atmosphere at elevated temperature, the metal surface and gaseous atmosphere being selected to cause a catalytic regrowth of the diamond grit and the metal surface being sufficiently thin that the metal surface is consumed by the treatment in the gaseous atmosphere.

The metal surface may be provided on an electrically-insulative substrate, such as selected from a group comprising silicon, quartz aluminum and glass. The diamond grit is preferably applied to the metal surface in a binder.

According to another aspect of the present invention there is provided a method of forming a diamond surface comprising the steps of providing a surface, depositing a mixture of a diamond grit and a metal powder onto the surface and subjecting the surface and deposited mixture to a gaseous atmosphere at elevated temperature, the metal powder and gaseous atmosphere being selected to cause a catalytic regrowth of the diamond grit.

The surface is preferably of an electrically-insulative material and the metal is preferably selected from a group comprising nicktel, silver, copper, titanium chromium, gold, lanthanum, cesium, magnesium, barium, aluminum and molybdenum. The diamond grit when applied preferably has a particle size in the range of a few tenths of a micron to a few microns. The gaseous atmosphere is preferably of a hydrogen-containing gas, the elevated temperature is preferably in the range 500 to 1000° C. and the gaseous atmosphere preferably has a pressure in the range of a few torr to several hundred torr. The gaseous atmosphere at elevated temperature is preferably produced by a microwave plasma reactor. The diamond grit may be doped with an n-type or p-type material. The diamond grit may be produced by crushing n-type or p-type CVD diamond film.

BRIEF DESCRIPTION OF THE FIGURES

A method of forming a diamond surface and a device with a diamond surface so formed, will now be described, by way of example, with reference to the accompanying drawings in which:

FIG. 5 is a sectional side elevation view of a display device in a diode configuration;

FIG. 6 is a sectional side elevation view of a display device in a triode configuration; and FIGS. 7 and 8 are sectional side elevation views of two different arrangements of displays in which the emitter has surface conduction modes.

DETAILED DESCRIPTION

Figure 1:
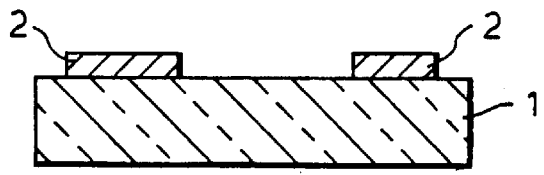
FIGS. 1 to 4 are simplified sectional side elevation views of different stages in the method of manufacture of the device, not to scale.

With reference to FIG. 1. there is provided an electrically-insulative substrate 1. sUcli as of silicon, quartz, alumina or glass, with two metal tracks 2 formed on its upper surface by any conventional technique, such as by deposition through a photo resist mask that is subsequently removed. The tracks 2 are about 1–50 μm thick and may, for example be of nickel, or any other metal effective to produce the catalytic action referred to below, such as silver, copper, titanium, chromium, gold, lanthanum, cesium, magnesium, aluminum or molybdenum.

Figure 2:
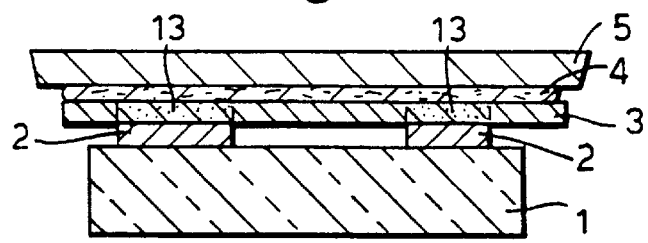
Figure 3:
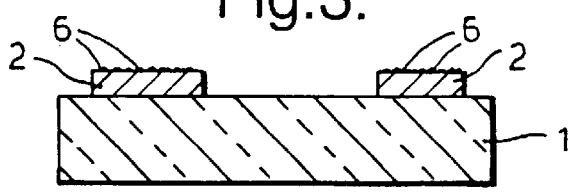

In the next stage, shown in FIG. 2, a silk screen 3 is placed on the upper surface of the substrate, the screen having a pattern of porous regions 13 corresponding to the location of the tracks 2. A paste 4 is then wiped over the upper surface of the screen 3 with a squeegee 5 so that the paste is pushed through the porous regions 13 onto the upper surface of the metal tracks 2. The paste 4 comprises a low-cost diamond grit, or nanogrit, with a particle size in the range of a few tenths of a micron to a few micron in a binder. The screen 3 is then removed and the substrate 1 with its paste-coated tracks 2 is placed in an oven to drive off the binder and leave the diamond grit 6, as shown in FIG. 3. Typically the density of diamond git 6 on the tracks 2 is about 10,000 per $cm^2$. Alternatively, the diamond grit could be deposited by ultrasonic abrasion, to embed it into the upper surface of the metal tracks.

The pattern of diamond grit could be produced on the surface by any conventional lithography technique, such as using electron-beam or X-ray beam techniques. The diamond grit could be coated by a spin-on technique, by printing or by electrophoresis.

Figure 4:
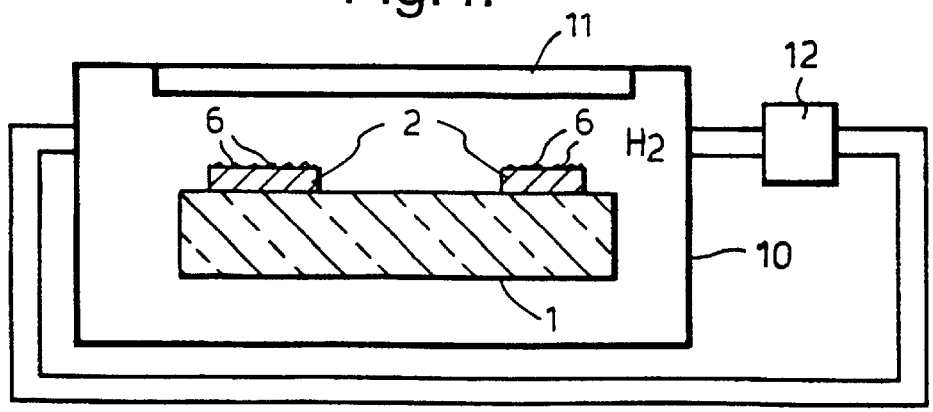

In the next step, as shown in FIG. 4, the substrate 1 is placed in a reactor chamber 10. The chamber 10 has a 6 kW microwave plasma reactor 11 and is connected to a hydrogen gas pump 12. The reactor 11 heats the substrate 1 to a temperature in the range 500–1000° C. and the pump 12 circulates hydrogen through the chamber 10 at a pressure in the range of a few tenths of a torr to several hundred torr for up to about 1 hour. Other forms of hydrogen plasma could be used and the plasma could contain hydrocarbon gases, such as methane. Other forms of heating could be used, such as RF heating.

The metal of the tracks 2 acts as a catalyst in the presence of the hydrogen plasma to cause regrowth of the diamond grit 6 into high quality, faceted, sharp-edged diamond grains of increased size, in the submicron to micron range. It also promotes the interface states formed between the diamond grit and residual metal or carbides, such as carbides formed by reaction between the metal and diamond (this is particularly applicable where the metal is molybdenum or titanium). The regrowth of the diamond, therefore, leads to an increase in the quality of the diamond because of the increased size and refined shape. The adhesion, and hence the electrical contact of the diamond with the underlying surface is also improved. The method also has the advantage that the regrowth of the diamond can be achieved relatively quickly.

The diamond grit 6 may be doped before applying to the tracks, with an n-type or p-type material. Alternatively, the diamond may be doped after applying it to the tracks such as by including the dopant in the hydrogen plasma treatment. This avoids the need for any additional surface treatments or metal coating to enhance electron emission. Diamond grit doped in this way exhibits a desirable depletion layer at the interface between the diamond crystal and the metal layer. Doped diamond grit could be produced by crushing n-type or p-type CVD diamond film. This has been found to enable a ready control of conductivity.

Instead of depositing the diamond nanogrit onto a preformed metal catalyst layer, the metal catalyst could be in powder form mixed with the diamond nanogrit and this powder mixture deposited onto a surface. The powder could be a metal oxide or other metal-containing powder.

It can be desirable, where the diamond grit is deposited onto a metal layer formed on a silicon substrate, for the metal layer to be sufficiently thin that it is consumed by the regrowth process. This enables the diamond particle to sink into physical contact with the underlying substrate.

The completed device may be used in the cathode of a field emission device, such as a display of the kind described in GCB2297862. The diamond surface could be used in planar emitter arrays, such as in display devices. The diamond surface could be applied to a cold cathode electrode such as in an LCD backlight.

FIGS. 5 to 8 show a device 20 to 20''' in different arrangements of light-emitting displays. The arrangement of FIG. 5 is a diode configuration with the device 20 supported on a cathode plate 21 beneath a transparent anode plate n having a low voltage phosphor layer 23 on its lower surface. The upper, exposed surface of the device 20 faces, and is spaced opposite, the phosphor 23, being separated from it by a vacuum. Electrons emitted by the device 20 are attracted to the anode plate 22, by a voltage of between about 500 and 1000 volts, and cause the phosphor layer 23 to fluoresce. It will be appreciated that the display would typically incorporate many such devices 20 so that the desired display representation can be produced by appropriately addressing individual devices in a conventional way.

The arrangement of FIG. 6 is similar to that of FIG. 5 but is a triode arrangement with a gate plate 24' between the cathode plate 21' and the anode plate 22'. By controlling the voltage on the gate plate 24', the flow of electrons from the device 20' to the anode plate 2' can be controlled.

The arrangement of FIG. 7 has a device 20" operating in a voltage-biased, surface conduction mode. Two electrodes 25" and 26" at opposite ends of the device 20" are connected to a low voltage dc source (approximately 14 volts), such as a battery 27".

The arrangement of FIG. 8 also has a device 20''' operated in a voltage-biased. surface conduction mode. In this arrangement. However, the phosphor 23''' is not located opposite the device 20''' but is mounted on a common insulative plate 25''' with the device in the same plane. The exposed surface of the fluorescent phosphor 23''', therefore, faces in the same direction as that of the device 20'''. Electrons emitted by the device 20''' follow a curved trajectory initially moving away from the plate 28''' and then moving back towards it under the attractive force of the positive voltage on the anode 22'''. This configuration has found to have several advantages in electron emitter displays in general compared with conventional configurations where the phosphor is located directly above the electron emitter. In particular, it avoids the need for spacers to maintain accurate spacing between opposite anode and cathode plates, it reduces the risk of contamination between the phosphor and electron emitter, and it makes registration between the phosphor region and the emitter easier, which is especially important in multi-colour displays.

The invention could also be used to form diamond surfaces on other devices such as on printed circuit boards where a conventional copper/Invar/copper layer could be replaced with a copper/diamond composite layer. The diamond layer has a very high thermal conductivity, making it particularly useful in applications where there is high thermal emission.

The method could be used to form abrasive devices. A diamond nanogrit abrasive device formed in this way has an increased effective life compared with conventional diamond grit abrasive devices. An abrasive pad formed in this way could be used, for example, in multiple metal layer CMP (chemical metal polishing) planarization processes.

What is claimed is:

1. A method of forming a diamond surface comprising the steps of providing a metal surface (2), depositing a layer of diamond grit (6) onto the surface and subjecting the surface and diamond grit to a gaseous atmosphere at elevated temperature, the metal surface and gaseous atmosphere being selected to cause a catalytic regrowth of the diamond grit, and the metal surface being sufficiently thin that the metal surface is consumed by the treatment in the gaseous atmosphere.

2. A method according to claim 1, characterized in that the metal surface (2) is provided on an electrically-insulative substrate (1).

3. A method according to claim 2, characterized in that the metal surface (2) is provided on a substrate (1) selected from a group comprising silicon, quartz, aluminum and glass.

4. A method according to claim 1, characterized in that the diamond grit (6) is applied to the metal surface as a paste (4) in a binder.

5. A method according to claim 1, characterized in that the metal (2) is selected from a group comprising nickel, silver, copper, titanium, chromiumn, gold, lanthanum, cesium, magnesium, barium, aluminum and molybdenum.

6. A method according to claim 1, characterized in that the diamond grit (6) when applied has a particle size in the range of a few tenths of a micron to a few microns.

7. A method according to claim 1, characterized in that the gaseous atmosphere is substantially of a hydrogen-containing gas.

8. A method according to claim 1, characterized in that the elevated temperature is in the range 500 to 1000° C.

9. A method according to claim 1, characterized in that the gaseous atmosphere has a pressure in the range of a few torr to several hundred torr.

10. A method according to claim 1, characterized in that the gaseous atmosphere at elevated temperature is produced by a microwave plasma reactor (11).

11. A method according to claim 1, characterized in that the diamond grit (6) is doped with an n-type or p-type material.

12. A method according to claim 1, characterized in that the diamond grit (6) is produced by crushing n-type or p-type CVD diamond film.

* * * * *